United States Patent [19]

Fujimura

[11] 4,423,127
[45] Dec. 27, 1983

[54] METHOD OF MANUFACTURING A SEMICONDUCTOR DEVICE

[75] Inventor: Shuzo Fujimura, Yokohama, Japan

[73] Assignee: Fujitsu Limited, Kawasaki, Japan

[21] Appl. No.: 331,477

[22] Filed: Dec. 16, 1981

[30] Foreign Application Priority Data

Dec. 29, 1980 [JP] Japan ................................ 55-187308

[51] Int. Cl.³ .............................................. G03C 5/06
[52] U.S. Cl. ........................................ 430/22; 430/5
[58] Field of Search ...................... 430/5, 22; 356/376, 356/399, 401, 138, 150, 153

[56] References Cited

U.S. PATENT DOCUMENTS 3,617,267 11/1971 Kinney ................................. 430/54
3,783,520 1/1974 King .................................... 430/22
4,309,813 1/1982 Hull ..................................... 430/22

Primary Examiner—John E. Kittle
Assistant Examiner—José G. Dees
Attorney, Agent, or Firm—Staas & Halsey

[57] ABSTRACT

In the manufacture of a semiconductor device wherein a plurality of patterns are successively superimposed and printed on a semiconductor substrate, the invention offers a novel and useful method which includes (a) printing and forming on the semiconductor substrate a first pattern which includes a first alignment mark, (b) in forming a second pattern on the substrate, positioning and printing a second alignment mark contained in a second pattern relative to the first alignment mark on the substrate in such a manner that at least one part of the contour of the first mark is offset from that of the second mark, and is spaced a minute distance from it, and (c) in forming a third pattern on the substrate, positioning and printing a third alignment mark contained in a third pattern in such a manner that a part of the contour of the third alignment mark is offset from a part of the contour of the first alignment mark, and at least a part of the other portion of the contour of the third alignment mark is similarly offset from a part of the contour of the second alignment mark. The invention also offers marks for correctly positioning or registering masks formed by the abovedescribed steps.

6 Claims, 16 Drawing Figures

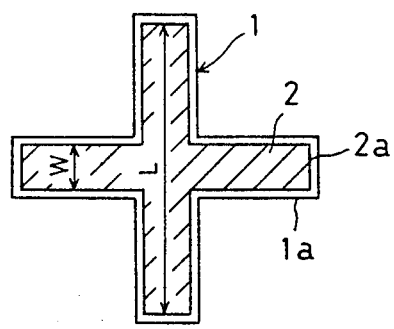
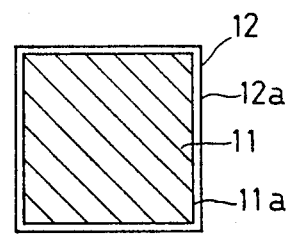
FIG. 1A PRIOR ART            FIG. 1B
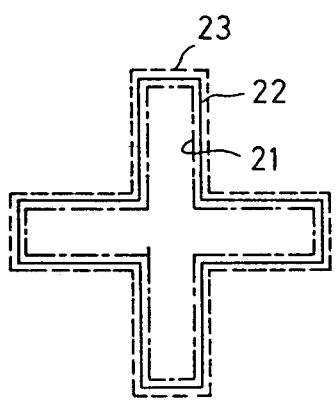
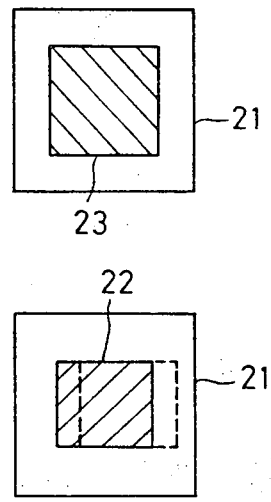
FIG. 2A PRIOR ART            FIG. 2B

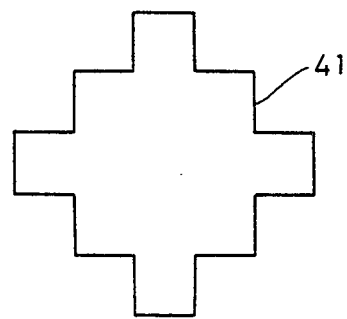
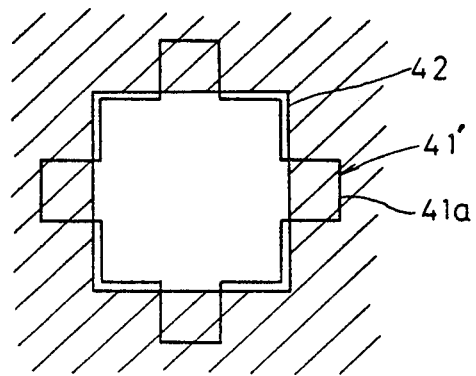
FIG. 7A  FIG. 7B
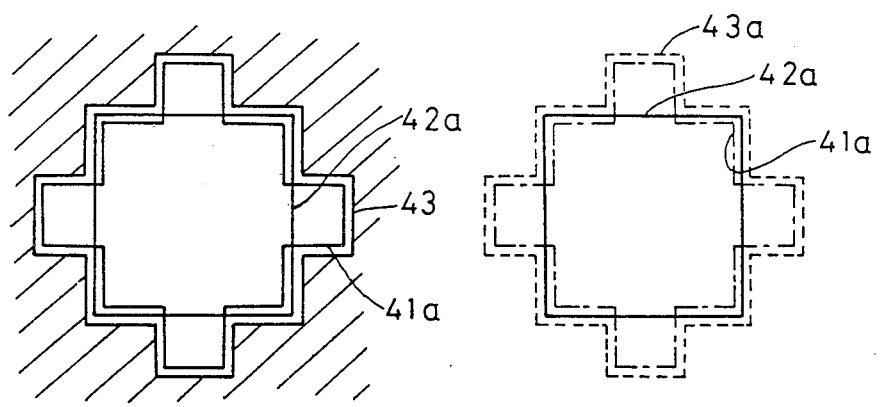
FIG. 7C  FIG. 7D

METHOD OF MANUFACTURING A
SEMICONDUCTOR DEVICE

BACKGROUND OF THE INVENTION

1. Field of the Invention

The present invention concerns a method of manufacturing a semiconductor device such as an integrated circuit, and also the pattern of alignment marks prepared for precise positioning of masks, or for testing the precision of alignment among plural layers for a semiconductor device.

2. Description of the Prior Art

For the purpose of ascertaining that a predetermined pattern of each layer of a multi-layer semiconductor device is correctly formed at a predetermined position on a semiconductor substrate, it is conventional to cause an alignment mark of a second mask for making a pattern of a second layer to be surrounded by, or to surround, an alignment mark printed at a predetermined position of the substrate by moving the second mask relative to the substrate. Shapes of such marks are shown in FIGS. 1A and 1B, and these marks are usually printed along one edge of a chip where elements of the device are not fabricated.

Referring to FIG. 1A, the second art practice is to position correctly a second mask for the second layer by moving it such that a mark 2 is surrounded by a printed mark 1 made on the surface of a substrate by a first mask for the first layer. In FIG. 1A, 1a denotes an edge or step formed on the substrate when mark 1 is made by a conventional patterning process for the first layer, for example, a selective etching process which has been carried out by using the first mask, and 2a denotes a pattern or contour of the second mark 2.

Similarly, a second mask for the second layer of FIG. 1B is correctly positioned or registered by placing a mark 11 made on the second mask for the second layer into a mark 12 formed on the substrate by the first mask. Also in FIG. 1B, 12a denotes an edge or step formed to the substrate, and 11a a pattern or contour of the mark 11.

In FIG. 1A, the distance L, the length of the mark 2, is in the order of 18 to 20 $\mu$m, and the distance W, the width of mark 2, is approximately 6 $\mu$m. The distance between the patterns 1a and 2a is in order of 2 $\mu$m. Whether or not the mark 2 correctly is surrounded by the mark 1 formed on the substrate is ascertained by visually examining the uniformity or symmetry of the distance or gap between the patterns 1a and 2a with a microscope. In FIG. 1B, the length of the pattern 12a is approximately 14 $\mu$m, and that of pattern 11a in the order of 10 $\mu$m. The distance between the patterns 11a and 12a, in the order of 2 $\mu$m, is also examined in the manner described above.

The patterns of the marks shown in FIGS. 1A and 1B not only make it possible to superimpose correctly the second mask for the second layer relative to the predetermined pattern of the elements of an integrated circuit and the like already formed on the substrate, but also enable testing or determination if each pattern is correctly positioned after the patterns of all layer have been formed on the substrate.

Where the predetermined patterns are used to form only two layers of a semiconductor device, difficult problems are not likely to be encountered with the marks shown in FIGS. 1A and 1B. However, where multi-layer patterns are to be formed on predetermined positions of the substrate, for example, where three or more patterns are to be formed, the method described above by reference to the patterns of FIG. 1A and FIG. 1B has been found ineffective.

Referring to FIG. 2A, for example, alignment of each layer will be realized by a method wherein an alignment mark 22 of the second layer is placed in a printed alignment mark formed on the substrate by a mark 21 of the first mask. Then, an alignment mark 23 of a third mask is placed on a printed alignment mark on the substrate made by using the mark 22 of the second mask. In the drawing, the marks printed on the substrate coincide with the alignment marks of the first and second masks.

In aligning these patterns, it is possible to ascertain the relative positioning of the mark printed by mark 21 of the first mask and the mark 22 of the second mask, and also that of the mark on the substrate printed by mark 22 of the second layer and the mark 23 of the third mask. However, it is difficult to ascertain the relative positioning of the mark on the substrate printed by mark 21 of the first mask and the mark 23 of the third mask because the symmetry of the gap between these marks can hardly be ascertained visually due to the interposing mark 22.

This means that alignment of the pattern of the third mask could be inaccurate and also that relative positioning of the pattern of each mask cannot be ascertained.

FIG. 2B illustrates another prior art usage where three masks, namely the first, second and third masks, are used. By using a mark 21 of the first mask, two alignment marks each of which is identical to mark 21 are printed on the substrate. An alignment mark 22 of the second mask is placed at a position in one of the printed marks 21 by movement of the second mask. When the process following formation of the mark corresponding to mark 22 is over, alignment mark 23 of the third mask is placed at a position in the other alignment mark 21 printed on the substrate by movement of the third mask. In the alignment illustrated, marks 22 and 23, shown by solid lines, are correctly positioned relative to the mark printed on the substrate corresponding to mark 21 of the first mask. However, there is no way to visually ascertain if marks printed on the substrate corresponding to marks 22 and 23 of the second and third masks are correctly positioned relative to each other. For example, if the mark corresponding to mark 22 of the second mask is printed on the substrate at a position shown by the dotted line with a positioning error within tolerance limits between the first and second patterns, it is difficult to visually ascertain whether the mark 23 is within the tolerance range with respect to the second pattern represented by the mark 22.

SUMMARY OF THE INVENTION

In view of the abovedescribed problems encountered in the prior art, it is a general object of the present invention to provide a method to ascertain relative positioning of three or more patterns by one alignment mark in the manufacturing process of a semiconductor device.

To achieve the above object of the invention, a novel method is offered in the manufacture of a semiconductor device by the process of successively superimposing and printing a plurality of patterns on a semiconductor substrate, and the method is characterized by the steps of: (a) printing and forming on the substrate a first pattern including a first alignment mark, (b) in the formation of a second pattern on the substrate, positioning and printing on the substrate a second alignment mark of the second pattern in such a manner that, relative to the first alignment mark on the substrate, at least one part of the contour of the first mark is offset from that of the second mark by a minute distance, and (c) in the formation of a third pattern on the substrate, positioning and printing a third alignment mark of the third pattern such that a part of the contour of said third mark is offset from a part of the contour of the first alignment mark and at least a part of another portion of the contour of said third mark is offset from a part of the contour of the second alignment mark.

In another embodiment of the invention for the manufacture of a semiconductor device by the process of successively superimposing and printing a plurality of patterns on a semiconductor substrate, the method is characterized by the steps of: (a) transferring on the substrate a mask pattern including a first alignment mark of a first photomask, (b) in the transfer of a mask pattern of a second photomask onto the substrate, positioning and then transferring a second alignment mark provided on the second photomask, relative to the first alignment mark on the substrate, such that the contours of the marks intersect with each other, and at least one part of one contour is offset from a part of the other, and (c) in the transfer of a mask pattern of a third photomask, positioning and then printing a third alignment mark provided on the third mask such that a part of the contour thereof is offset from a part of the contour of the first alignment mark, and at least one part of another portion of said contour of the third mark is offset from at least a part of the contour of the second alignment mark.

To achieve the abovedescribed object of the invention, marks for positioning or registration of masks are offered which are characterized in that the marks comprise first, second and third alignment marks each having a closed loop contour, the contours of the first and second alignment marks intersect with each other with at least portions thereof offsetting each other, a part of the contour of the third alignment mark is offset from a part of the first alignment mark, and at least one part of another portion of the contour of the third mark is offset from at least one part of the second alignment mark.

In other words, there are provided according to the invention an alignment mark made on the substrate using the pattern of the first mask and an alignment mark of the second mask which has a shape different from that of the alignment mark already made on the substrate, with a part of the periphery of each alignment mark intersecting with each other, and an alignment mark of the third mask is caused to be surrounded by, or surrounds, a composite pattern made of the alignment marks of the first and second masks.

The above and further objects and novel features of the invention will appear more fully from the following detailed description when read in connection with the accompanying drawings. It is to be expressly understood, however, that the drawings are not intended as a definition of the invention but are for the purpose of illustration only.

BRIEF DESCRIPTION OF THE DRAWINGS

In the drawings in which like parts are marked alike: FIGS. 1A, 1B, 2A and 2B are the views which show relative positions of alignment marks in accordance with the prior art.

DESCRIPTION OF THE PREFERRED EMBODIMENT

Figure 3A:
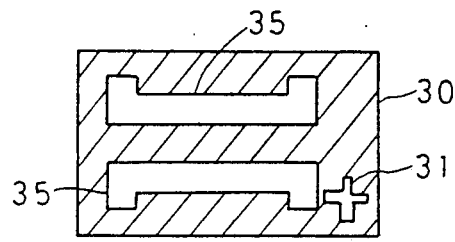
FIGS. 3A, 4A and 5A are plan views of masks used to carry out the method of the invention.
Figure 3B:
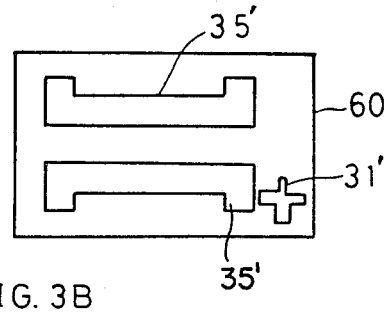
FIGS. 3B, 4B and 5B are plan views of chips on which patterns are formed using the masks shown.
Figure 4A:
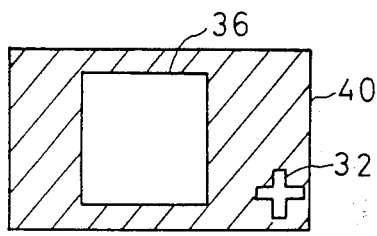
Figure 4B:
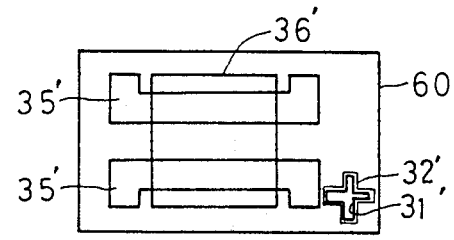
Figure 5A:
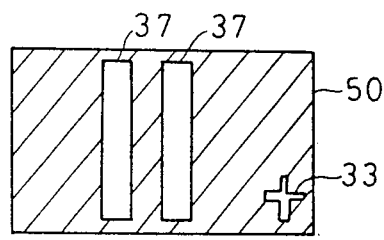
Figure 5B:
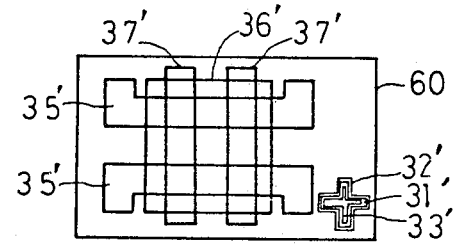

Reference will now be made to FIGS. 3A, 3B, 4A, 4B, 5A and 5B. Of these, FIGS. 3A, 4A and 5A show patterns of masks such as photomasks for making the patterns shown in FIGS. 3B, 4B and 5B, each of which is a plan view of a chip in a semiconductor wafer after the patterning or etching process has been carried out.

A first mask 30 shown in FIG. 3A is provided with a pair of patterns 35 and an alignment mark 31. This first mask 30 is superimposed on a chip 60 which is coated with photoresist, for example. After exposure to ultraviolet light through the aligned mask and development of the exposed photoresist, etching of the underlying layer is carried out using the resultant resist pattern as a mask as in the conventional art to print and form patterns 35', 35' and alignment mark 31' which is identical to the mark 31. The mark 31' may be depressed in the chip 60 or protrude from its surface. The line or configuration of the mark 31' is thus an edge or step formed on the chip 60.

In forming a second layer of the device, a second mask 40 shown in FIG. 4A is prepared. This second mask 40 is provided with a rectangular pattern 36 and an alignment mark 32. The second mask 40 is then superimposed on the chip 60 which has passed through process steps and is coated with photoresist again. The alignment mark 32 is superimposed on the printed mark 31'. By visual inspection using a microscope, it is examined to see if a part of the contour of the mark 31' is evenly spaced apart from a part of the contour of the alignment mark 32. Usually, the distance between the two is in the order of 2 μm.

Whenever it is determined that the second mask 40 is correctly positioned, then exposure and development of the photoresist, etching and so forth are carried out in a known manner to form or print on the chip 60 a pattern 36' and an alignment mark 32' which is identical to the mark 32 of the second mask 40. By now, the chip 60 has patterns 35', 35', 36' and alignment marks 31' and 32'.

In FIG. 5a there is shown a third mask 50 used to form a third layer. This third mask 50 is provided with a pair of patterns 37 and an alignment mark 33. It is superimposed on the chip 60 in the same manner as was explained before by reference to the second mask 40, and after exposure and development of the photoresist, etching is carried out to make the patterns 37', 37' using the photoresist pattern as an etching mask and an alignment mark 33' which also is identical to the alignment mark 33. The chip 60 now has three layers formed thereon consisting of the patterns 35', 35', 36', 37' and 37' as well as three alignment marks 31', 32' and 33'.

Figure 6:
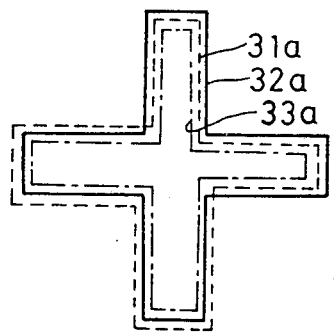
FIG. 6 is a plan view of the alignment marks shown in FIGS. 3A to 5B, and FIGS. 7A to 7D show other alignment marks according to the invention.

Three alignment marks as explained so far are shown in FIG. 6. These are superimposed as shown, and a contour or periphery 31a (dotted line) of the mark 31' made by the first mark 30 is so designed that it intersects the contour or periphery 32a (solid line) of the mark 32' formed by the second mask 40. Further, alignment of the third mask was effected by positioning the alignment mark 33 of the third mask in a region formed by contours or peripheries of the marks 31' and 32'. In aligning each alignment mark of each mask with respect to a mark already formed on the chip 60, the mask is so disposed that the gap between the contours of the alignment mark and the mark on the chip is evenly formed around two finger portions out of four where these contours are directly offset from each other without an interposition of the contour of another mark therebetween. Such a gap is typically designed to be 2 microns, which can hardly be measured visually with accuracy, but can be ascertained by observing the evenness of the gap or space between the contours around the mark using a microscope. After completion of the patterning of three layers, the examination of the alignment accuracy among those layers can be carried out similarly. The alignment accuracy between each pair of layers among three is ascertained by observing the evenness of the gap between the corresponding pair among the marks 31a, 32a and 33a around the correspondng two finger portions where the contours of the pair of marks are offset from each other.

FIGS. 7A to 7C show other alignment marks according to the invention. In FIG. 7A is shown an alignment mark of the first mask. In FIG. 7B, an alignment mark 42 of the second mask is superimposed on a printed alignment mark 41' which is identical to the mark 41. The contour or periphery 41a of the mark 41' is an edge or step formed on the chip. In FIG. 7C, alignment mark 43 of the third mask is superimposed on the contours or peripheries 41a and 42a of the marks 41' and 42' printed on the chip.

In FIG. 7D, three alignment marks of the three masks according to the invention are shown superimposed. The contour or periphery 42a of the second mask is aligned or positioned correctly by utilizing a part of the periphery 41a of the first alignment mark already printed and formed on the substrate using the first mask. The distance between contours or peripheries 41a and 42a where closely offset from each other is in order of 2 μm. The contour or periphery 43a of the third mask surrounds the region of a composite mark formed by the first and second alignment marks already printed and formed on the substrate. The periphery 43a is 2 μm apart from the contour or line of other marks immediately next to it.

As will be understood from the description of the embodiments of the invention, it is possible to ascertain the relative position of each pattern of three layers by means of alignment marks prepared in accordance with the invention.

Where masks were registered using marks according to the prior art, there was another problem involving errors in alignment. In the old art, in addition to an arror $\Delta x$ in aligning the mark of the second mask to the pattern of the first layer, there was again another error $\Delta x$ in aligning the mark of the third mask to the pattern of the second layer. Thus, there was a potential risk of an error in the magnitude of 2 $\Delta x$ between the patterns of the first and third layers. However, according to the present invention the mark of the third mask is in essence equally spaced from each pattern of the first and second layers because the mark of the third layer is aligned at a position which is spaced from the mark of the first layer by a distance of $\Delta x/2$. The error when practicing the present invention can hardly be equal to, or exceed, the value $\Delta x$.

For example, if the tolerance of error is in the order of 1.0 μm in aligning each layer, it has been confirmed that, according to the invention, the defects in aligning all three layers were reduced approximately 40%. Where the third layer alone was concerned, it was found that the defects were reduced approximately 43%.

So far, three layer patterns were considered in the explanation of embodiments of the invention. However, the present invention is not limited to the use of three layers, but may be applied likewise to multi-layers of more than three. In other words, where layers more than three are involved, the steps explained above are merely repeated.

Furthermore, the patterns according to the invention need not be symmetrical with regard to a particular direction or a point. If alignment in the vertical or horizontal relationship is possible, any form of pattern may be used in carrying out the method of the invention.

As has been described so far, alignment of marks of the third and further layers is realized by using parts of peripheries of the patterns made by the first and second masks. Because of this, it has become possible to ascertain the relative position of multiple layers by one pattern. Further, since there is no need to provide a number of patterns at different positions, it has become possible to reduce the area on which the alignment marks are printed and formed, and to simplify and automate the inspection and testing involved. In addition to the above, it is also possible to improve the degree of precision in the alignment of various patterns.

Thus, the invention having been described in its best embodiment and mode of operation, that which is desired to be claimed and protected by Letters Patent is:

1. In a method of manufacturing a semiconductor device by successively superimposing and printing on a semiconductor substrate a plurality of patterns, the improvement comprising:
   (a) transferring onto said substrate a mask pattern including a first alignment mark of a first photomask, said first alignment mark having a closed loop contour,
   (b) in the transfer of a mask pattern of a second photomask onto said substrate, positioning and then transferring a second alignment mark having a closed loop contour provided with said second photomask, relative to said first alignment mark on said substrate, in such a manner that the contour of each mark intersects with that of the other, and at least one part of one contour is offset from a closely adjacent part of the contour of the other and substantially parallel thereto, and
   (c) in the transfer of a mask pattern of a third photomask, positioning and then printing a third alignment mark having a closed loop contour provided with said third mask in such a manner that a part of the contour thereof is offset from a closely adjacent part of the contour of said first alignment mark and substantially parallel thereto, and at least one part of another portion of the contour of the third mark is offset from a closely adjacent part of the contour of said second alignment mark and substantially parallel thereto.

2. Marks for positioning of masks, comprising: first, second and third alignment marks deposited in layers on a substrate and each having a closed loop contour, the contours of said first and second alignment marks intersecting with each other with at least one part thereof being offset from and closely adjacent to each other, a part of the contour of said third alignment mark being offset from and closely adjacent to a congruent part of said first alignment mark, and at least one part of another portion of said contour of the third mark being offset from and closely adjacent to at least a part of said second alignment mark that is congruent thereto.

3. The method of manufacturing a semiconductor device wherein a plurality of patterns are successively superimposed and printed onto a semiconductor substrate, which comprises the steps of:

providing on the semiconductor substrate a first pattern having a first alignment mark, said first alignment mark having a closed loop contour, providing a second pattern having a second alignment mark, said second alignment mark having a closed loop contour, positioning the second pattern and mark relative to the first alignment mark on the substrate so that at least part of the contour of the first mark is adjacent to a congruent part of the contour of the second mark and only a minute distance apart therefrom, printing the second pattern after it is positioned, providing a third pattern on the substrate having a third alignment mark, said third alignment mark having a closed loop contour, positioning the third pattern and mark so that part of the third alignment mark is over parts of the first and second aignments marks and so that a part of the contour of the third aignment mark is adjacent to a congruent part of the contour of the first alignment mark, and at least another part of the contour of the third alignment mark is adjacent to a congruent part of the contour of the second alignment mark, and printing the third pattern after it is positioned.

4. A method of manufacturing a semiconductor device having a plurality of patterns which are successively superimposed and printed on a semiconductor substrate, comprising the steps of:

printing and forming on said semiconductor substrate a first pattern having a first alignment mark, said first alignment mark having a closed loop contour, positioning on said substrate a second pattern having a second alignment mark with a closed loop contour in such a manner that at least one part of the contour of the first mark is closely adjacent a congruent part of the contour of the second mark and spaced minutely from it, and then forming the second pattern on said substrate, and positioning a third pattern having a third alignment mark with a closed loop contour overlapping the previous two alignment marks in such a manner that a part of the contour of the third alignment mark is closely adjacent to a congruent part of the contour of the first alignment mark, and at least a part of another portion of the contour of said third alignment mark is closely adjacent to a congruent part of the contour of the second alignment mark, and then forming the third pattern on the substrate.

5. A method of manufacturing a semiconductor device by successively superimposing and printing on a semiconductor substrate a plurality of patterns, including the steps of:

transferring onto a semiconductor substrate a mask pattern having a first alignment mark from a first photomask, said first alignment mark having a closed loop contour;

positioning a second photomask having a second alignment mark with a closed loop contour over the pattern formed on the semiconductor substrate by the first photomask and aligning the second photomask by use of the second alignment mark by positioning same so that the contour outlines of the first and second alignment marks intersect each other at at least one point, and at least another part of the contour outlines of the first and second alignment marks are positioned closely adjacent to congruent portions of each other, and after alignment of the second photomask then transferring same onto said substrate; and positioning a third photomask over the first and second patterns formed on the semiconductor substrate, said third photomask having a third alignment mark with a closed loop contour, and aligning the third mark with at least part of the contour outline of the third mark being positioned closely adjacent to a congruent part of the contour outline of the first alignment mark, and at least another part of the contour outline of the third mark being positioned closely adjacent to a congruent part of the contour outline of the second alignment mark, and after alignment of the third photomask then transferring same onto said substrate.

6. A plurality of photomasks for use in forming a plurality of superimposed patterns on a semiconductor substrate, comprising:

a first photomask having a first alignment mark located in a peripheral area of said photomask, a second photomask having a second alignment mark positioned in a peripheral area of said photomask, and a third photomask having a third alignment mark positioned in a peripheral area thereof, each of said first, second, and third alignment marks having a contour with an irregular outline perimeter different from each other so that some parts of the contours of at least two alignment marks will intersect with each other when superimposed and other parts of the contours of said at least two alignment marks will be closely spaced apart from substantially parallel segments of each other when said marks are superimposed.

* * * * *

UNITED STATES PATENT AND TRADEMARK OFFICE
CERTIFICATE OF CORRECTION

PATENT NO. : 4,423,127
DATED : December 27, 1983
INVENTOR(S) : Shuzo Fujimura

It is certified that error appears in the above-identified patent and that said Letters Patent is hereby corrected as shown below:

Column 1, line 26, "second" should be --prior--.
Column 4, line 65, "mark" should be --mask--.
Column 5, line 55, "arror" should be --error--.
Column 7, line 30, "aignment" should be --alignment--;
          line 31, "aignment" should be --alignment--.

Signed and Sealed this

Eighth Day of May 1984

[SEAL]

Attest:

GERALD J. MOSSINGHOFF

Attesting Officer    Commissioner of Patents and Trademarks